United States Patent
Li et al.

(10) Patent No.: US 6,601,292 B2
(45) Date of Patent: Aug. 5, 2003

(54) METHOD FOR THE CONNECTION AND REPAIR OF FLEX AND OTHER CIRCUITS

(75) Inventors: Delin Li, Canton, MI (US); Jay DeAvis Baker, W. Bloomfield, MI (US); Achyuta Achari, Canton, MI (US); Brenda Joyce Nation, Troy, MI (US); John Trublowski, Troy, MI (US)

(73) Assignee: Visteon Global Technologies, Inc., Dearborn, MI (US)

(*) Notice: Subject to any disclaimer, the term of this patent is extended or adjusted under 35 U.S.C. 154(b) by 50 days.

(21) Appl. No.: 09/891,697

(22) Filed: Jun. 26, 2001

(65) Prior Publication Data

US 2001/0035301 A1 Nov. 1, 2001

Related U.S. Application Data

(62) Division of application No. 09/387,808, filed on Sep. 1, 1999, now Pat. No. 6,274,819.

(51) Int. Cl.[7] .................................................. H05K 3/00
(52) U.S. Cl. ................... 29/829; 29/402.08; 29/402.09; 29/854; 174/254; 174/262; 361/749; 361/778; 361/789; 439/60; 439/67; 439/924.1
(58) Field of Search ...................... 29/402.01, 402.03, 29/402.08, 402.09, 592.1, 829, 830, 831, 832, 412, 417, 852, 854; 174/254, 250, 261, 262, 117 F, 117 FF; 361/749, 750, 751, 777, 778, 789, 803; 439/493, 67, 150, 60, 724.1

(56) References Cited

U.S. PATENT DOCUMENTS

| | | | |
|---|---|---|---|
| 3,226,473 A | 12/1965 | Dahlgren | 174/117 |
| 5,712,764 A | 1/1968 | Baker et al. | 361/690 |
| 3,551,585 A | 12/1970 | Smart et al. | 174/68.5 |
| 3,728,471 A | 4/1973 | Blinkhorn | 174/68.5 |
| 4,130,723 A | 12/1978 | Wakeling | 174/68.5 |
| 4,362,899 A | 12/1982 | Borrill | 174/36 |
| 4,509,095 A | 4/1985 | Boros | 361/386 |
| 4,889,275 A | 12/1989 | Mullen, III et al. | 228/180.2 |
| 5,255,155 A | 10/1993 | Sugimoto et al. | 361/749 |
| 5,305,130 A | 4/1994 | Yamawaki | 359/88 |
| 5,419,038 A | 5/1995 | Wang et al. | 29/830 |
| 5,428,190 A * | 6/1995 | Stopperan | 174/261 |
| 5,594,214 A | 1/1997 | Liao | 174/117 F |
| 5,700,979 A | 12/1997 | Lewis et al. | 174/117 |
| 5,742,484 A | 4/1998 | Gillette et al. | 361/789 |
| 5,811,727 A | 9/1998 | Lo | 774/36 |
| 5,844,783 A | 12/1998 | Kojima | 361/777 |
| 6,118,081 A | 9/2000 | Faragi et al. | 174/260 |
| 6,201,689 B1 * | 3/2001 | Miyasyo | 361/681 |

FOREIGN PATENT DOCUMENTS

| | | |
|---|---|---|
| DE | 1893562 U | 5/1964 |
| DE | 3045236 | 7/1982 |
| EP | 03194868 A | 8/1991 |
| EP | 11167971 A | 6/1999 |

* cited by examiner

*Primary Examiner*—Peter Vo
*Assistant Examiner*—Donghai D. Nguyen
(74) *Attorney, Agent, or Firm*—Brinks Hofer Gilson & Lione

(57) ABSTRACT

A method for making and repairing connections between first and second circuits, such as flex circuits. An article 10 includes: a flexible dielectric substrate 12 having first and second edges 14/16, and a plurality of conductive circuit traces 18 arranged on or within the substrate, wherein each of the traces extends from proximate the first edge 14 to proximate the second edge 16. Each of the circuit traces 18 includes: a first connection feature 20 disposed proximate the first edge 14; a second connection feature 22 disposed proximate the second edge 16; and at least one third connection feature 24 disposed between the first and second edges 14/16. Each of the first, second, and third connection features 20/22/24 is a plated through hole, a plated blind via, or a mounting pad. This article 10 may be used to connect together the first and second circuits 50/60 using the first and second connection features 20/22, such as by soldering. If either of the two circuits needs to be subsequently detached (e.g., because of a component failure), the article 10 may be cut so as to present a set of third connection features 24 to which a new replacement circuit may be connected.

9 Claims, 4 Drawing Sheets

METHOD FOR THE CONNECTION AND REPAIR OF FLEX AND OTHER CIRCUITS

CROSS REFERENCE TO APPLICATION

This application is a divisional application of Ser. No. 09/387,808, filed Sep. 1, 1999, now U.S. Pat. No. 6,274,819 B1 granted on Aug. 14, 2201.

BACKGROUND OF THE INVENTION

1. Field of the Invention

The present invention relates generally to electrical circuits, such as flexible printed circuits (i.e., "flex circuits"), and more particularly to a method and article for the connection and repair of electrical/flex circuits.

2. Disclosure Information

In the prior art, it is well known to use flex circuitry (instead of conventional round-wire wiring harnesses) to electrically connect together various electrical/electronic components, such as modules, motors, instrumentation, and the like. Most conventional wire harnesses are provided with male or female ganged connectors at either end, which mechanically and electrically connect to corresponding female or male connectors on the electrical/electronic components. One advantage of using flex circuitry over conventional wire harnesses is that often the male/female connectors may be reconfigured, reduced, or eliminated altogether (such as by soldering the ends of the flex directly to the electrical/electronic components). This is advantageous because typically connectors are expensive, require high assembly labor costs, and are the most failure-prone element both during manufacturing and after sale or installation. Also, flex circuits often provide certain packaging, weight, and design efficiencies that make it more advantageous than wiring harnesses.

However, despite these advantages, the use of flex circuitry may sometimes suffer from certain disadvantages. For example, when one of the electrical/electronic components fails, it may be difficult to disconnect the component from the flex to which it is attached, and/or to disconnect the component-connected piece of flex from the rest of the circuit. In fact, poor repairability is one of the overall drawbacks of using flex. It would be desirable, therefore, to provide a way of facilitating repair of flex circuits.

SUMMARY OF THE INVENTION

The present invention overcomes the disadvantages of the prior art approaches by providing an article and method for making and repairing connections between first and second circuits, such as flex circuits. The article includes: a flexible dielectric substrate having first and second edges, and a plurality of conductive circuit traces arranged on or within the substrate, wherein each of the traces extends from proximate the first edge to proximate the second edge. Each of the circuit traces includes: a first connection feature thereof disposed proximate the first edge; a second connection feature thereof disposed proximate the second edge; and at least one third connection feature thereof disposed between the first and second edges. Each of the first, second, and third connection features is a plated through hole, a plated blind via, or a mounting pad. This article may be used to connect together the first and second circuits using the first and second connection features, such as by soldering. If either of the two circuits needs to be subsequently detached (e.g., because of a component failure), the article may be cut so as to present a set of third connection features to which a new replacement circuit may be connected.

It is an object and advantage that the present invention may be used both to connect together two or more initial circuits, and to provide for removal of one of the initial circuits and substitution therefor with a replacement circuit.

Another object and advantage is that the present invention provides for an article and method for repairing flex circuits which is quicker, easier, less expensive, and more reliable than prior art approaches.

Yet another object and advantage is that the present invention may be used to make and repair connections not only between flex circuits, but also between other types of circuits such as FR-4 or ceramic printed circuit boards.

These and other advantages, features and objects of the invention will become apparent from the drawings, detailed description and claims which follow.

DETAILED DESCRIPTION OF THE PREFERRED EMBODIMENTS

Figure 1:
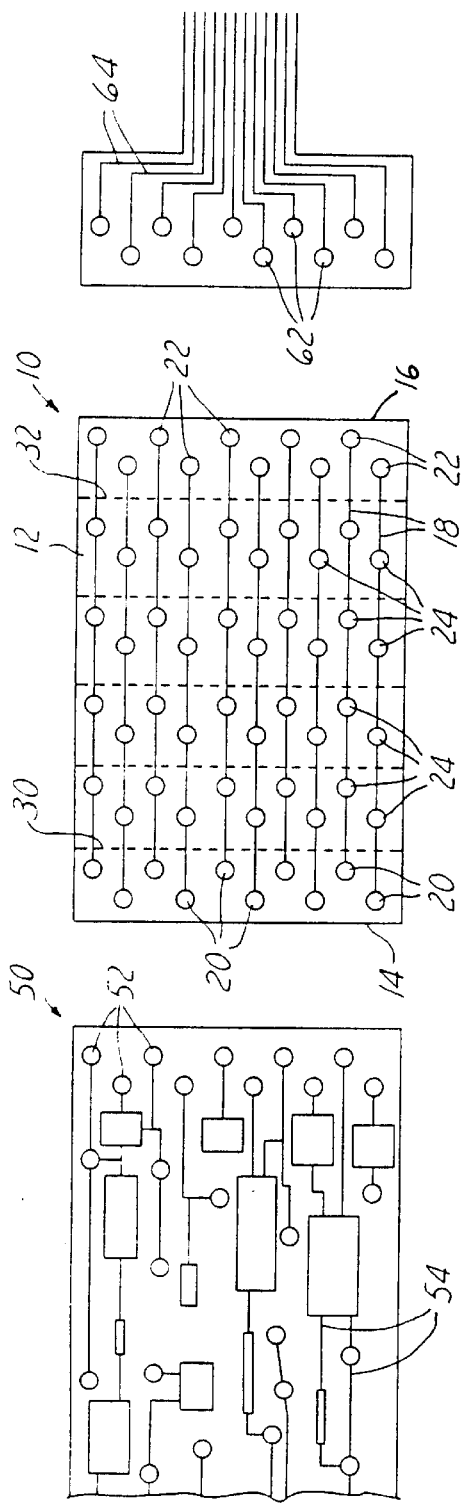
FIGS. 1–2 are plan views of first and second flex circuits and the article of the present invention, respectively before and after connection thereof.

Referring now to the drawings, FIGS. 1–4 show an article and method for making and repairing connections between first and second circuits (e.g., flex circuits) according to the present invention. As illustrated in FIG. 1, the interconnecting article 10 of the present invention includes: a flexible dielectric substrate 12 having first and second edges 14/16, and a plurality of conductive circuit traces 18 arranged on or within the substrate, wherein each of the traces extends from proximate the first edge 14 to proximate the second edge 16. Each of these circuit traces 18 includes: a first connection feature 20 disposed proximate the first edge 14; a second connection feature 22 disposed proximate the second edge 16, and at least one third connection feature 24 disposed between the first and second edges 14/16.

Figure 2:
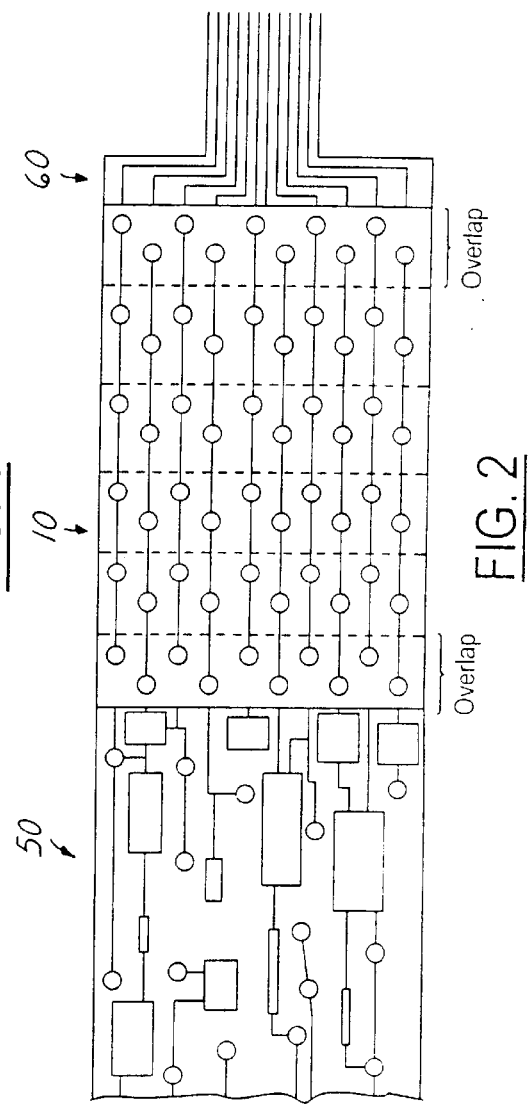

To assist the reader in understanding the present invention, all reference numbers used herein are summarized in the table below, along with the elements they represent:

10=Article of the present invention
10'=Another (second) article of the present invention
12=Flexible dielectric substrate
14=First edge of substrate
14'=New first edge formed after cutting article
16=Second edge of substrate
18=Circuit trace of article
20=First connection feature
22=Second connection feature
24=Third connection feature
26=Straight alignment line
28=Zigzagged alignment line
30=Cutting line for removal of first flex circuit 32=Cutting line for removal of second flex circuit
50=First circuit
52=Connection features on first circuit end
54=Traces on first circuit
60=Second circuit
62=Connection features on second circuit end
64=Traces on second circuit
70=Third (replacement) circuit
72=Connection features on third circuit end
A=Region of straight-line connection feature alignment Each of the first, second, and third connection features 20/22/24 is preferably a plated through hole, but may alternatively be a plated blind via or a mounting pad/solder pad instead. In either case, the connection features 20/22/24 should be exposed (i.e., not covered over by the flex's top polymer layer) so as to be readily interconnectable, such as by soldering (most preferably), or by other means such as ultrasonic welding, heat staking, crimping, pinning, or the like. Regardless of the processing method selected, connection is made by aligning the article 10 and the first and second circuits 50/60 such that the connection features 52 of the first circuit 50 overlap (or are overlapped by) the article's first connection features 20, and the connection features 62 of the second circuit 60 overlap (or are overlapped by) the article's second connection features 22, as illustrated in FIG. 2. Once the respective connection features of the article 10 and the first/second circuits 50/60 are thusly aligned, the overlapping features 20/22/52/62 may be connected together. When soldering is used and the connection features 20/22/52/62 are plated through holes, it may be desirable to insert a pin through each pair of overlapping holes prior to soldering, in order to assist in alignment and joint strengthening.

While the connection features 20/22/24 may be arranged across the article 10 in a wide variety of ways, it is preferred that they be generally evenly distributed along the length of each trace 18. Also, prior to any repair (described below), preferably each trace 18 terminates proximate the first and second edges 14/16 at a first and second connection feature 20/22, respectively. Additionally, it should be apparent that the connection features 20/22/24 on the interconnecting article 10 should be arranged so as to matchingly correspond with the respective connection features 52/62 of the first and second circuits 50/60; that is, the pattern and spacing of the article's connection features 20/22/24 should essentially mirror that of the corresponding circuits' connection features 52/62. This is desired so that proper alignment of the overlapping connection features can be achieved. For example, each of the first, second, and third connection features 20/22/24 may be aligned—with respect to all corresponding other of the first, second, and third connection features—either (1) along a generally straight line 26 running transverse to the length of the traces 18 (see end "A" of FIG. 5), or (2) along a generally zigzagged line 28 running transverse to the traces (see FIGS. 1–4).

With the connection features of the article 10 and two circuits 50/60 aligned and connected as described above, the article 10 of the present invention serves to electrically and mechanically connect together the traces 54 of the first circuit 50 with the corresponding traces 64 of the second circuit 60, through the traces 18 of the interconnecting article 10.

Figure 3:
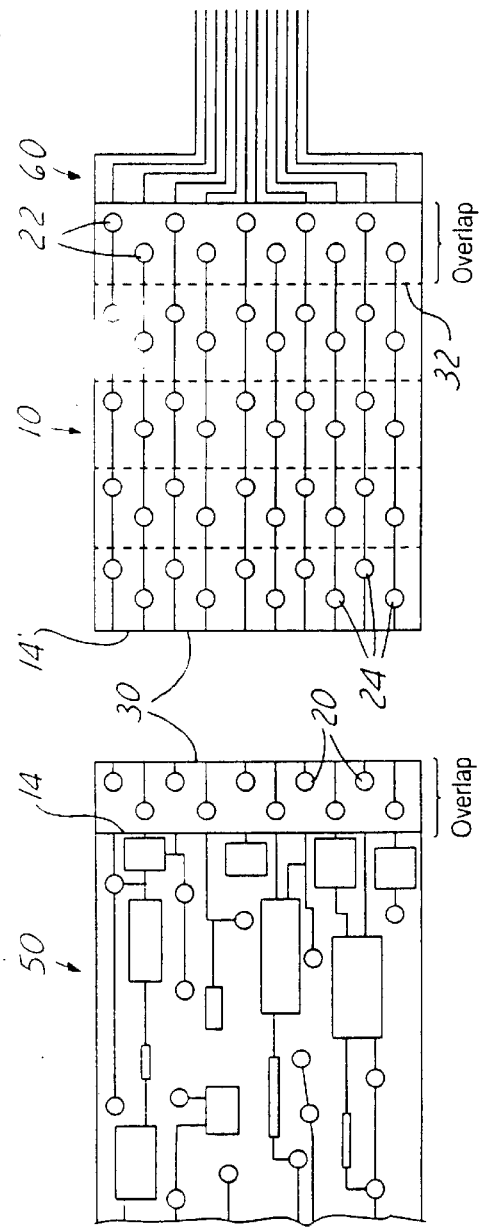
FIGS. 3–4 are plan views of the circuit connection shown in FIG. 2 after cutting along a cutting line thereof, respectively before and after replacing the first flex circuit with a third flex circuit.
Figure 4:
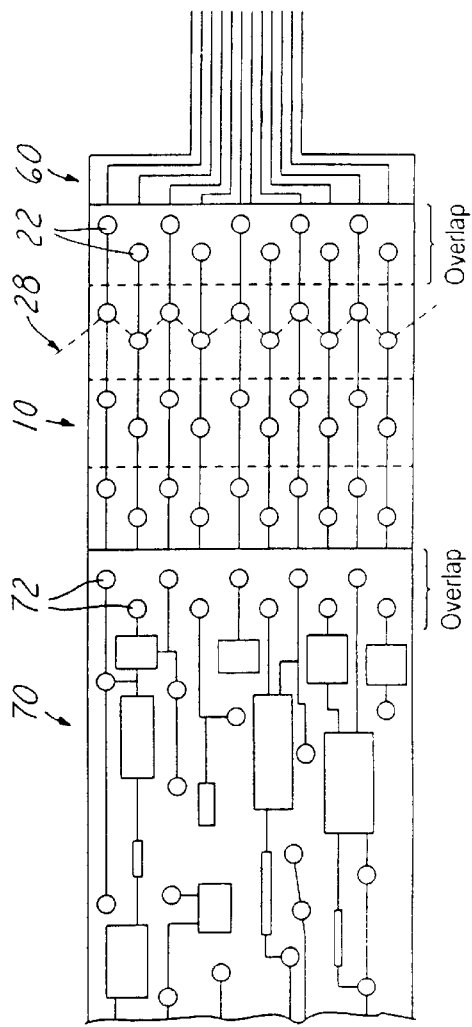
Figure 5:
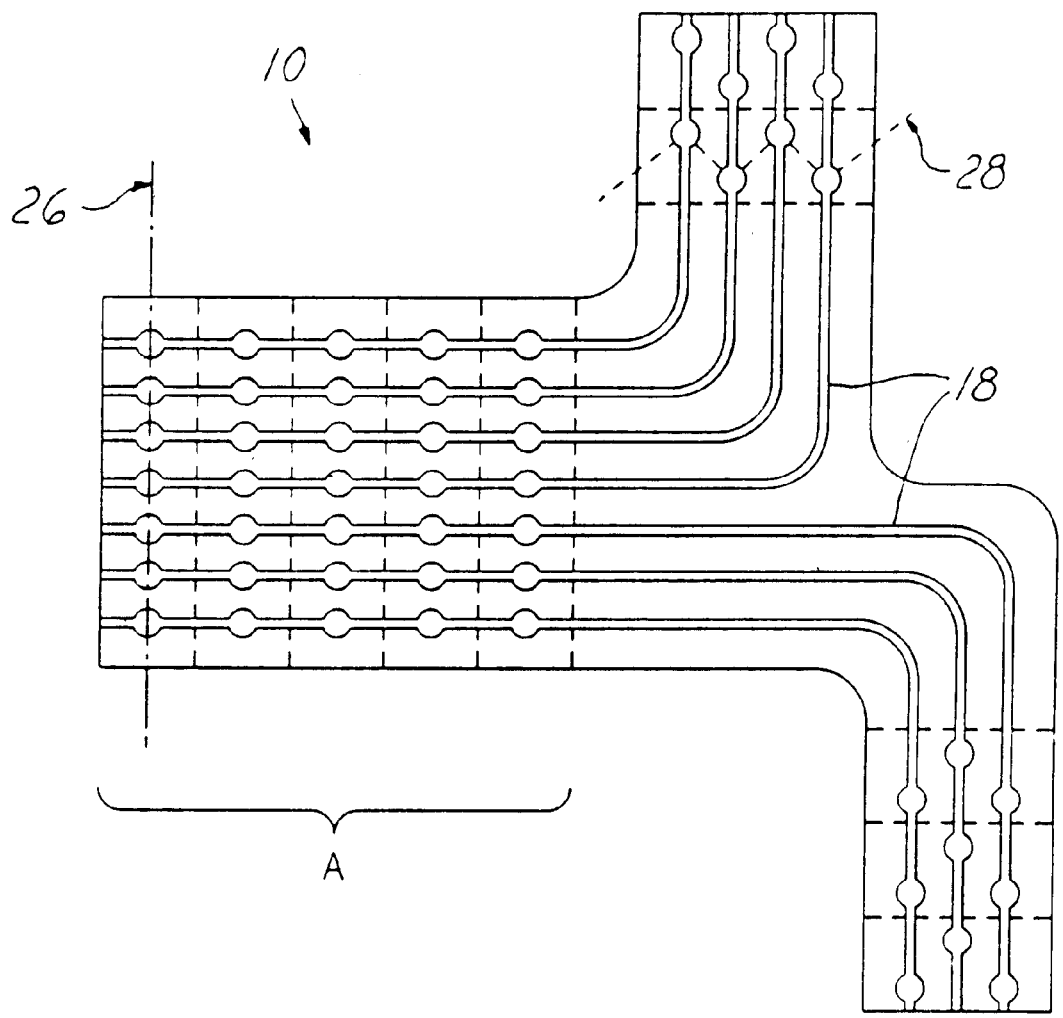
FIG. 5 is a plan view of an alternative embodiment of the present invention for connecting together three flex circuits.

If either of the two circuits 50/60 needs to be subsequently detached (e.g., because of a component failure associated with one of the circuits), the article 10 may be cut so as to present a set of third connection features 24 to which a new replacement circuit 70 may be connected. The replacement process is illustrated in FIGS. 3–4, where the replacement of the first circuit 50 is illustrated. The process is begun by cutting the article 10 along a cutting line 30 which runs transverse to the traces 18 between the first connection features 20 and the adjacent set of third connection features 24, as shown in FIG. 3. This essentially presents these third connection features 24 so as to be the connection features closest to the newly cut first edge 14'. Then, the article 10 and new circuit 70 may be aligned such that the new connection features 72 overlap (or are overlapped by) the article's third connection features 24 proximate the newly cut first edge 14', as illustrated in FIG. 4.

As this process illustrates, the article 10 may not only be used to initially connect together the two circuits 50/60, but may be beneficially used to remove one of the circuits 50/60 from the overall circuit connection and easily replace it with a new one 70. If the article 10 is provided with only one set of third connection features 24, then only one repair/replacement using that article 10 may be performed after the initial connection; however, if more than one set of third connection features 24 are provided, then an equal number of repairs may be made using that article 10. The number of third connection feature sets 24 provided should be determined according to how often repair of the circuit is anticipated.

Figure 6:
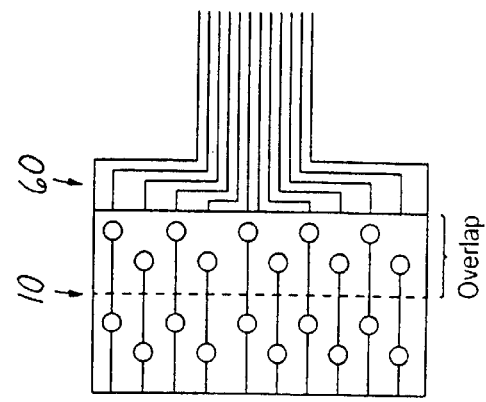
FIGS. 6–7 are plan views showing connection of a second article of the present invention with a first article thereof, respectively before and after cutting the first article.
Figure 6:
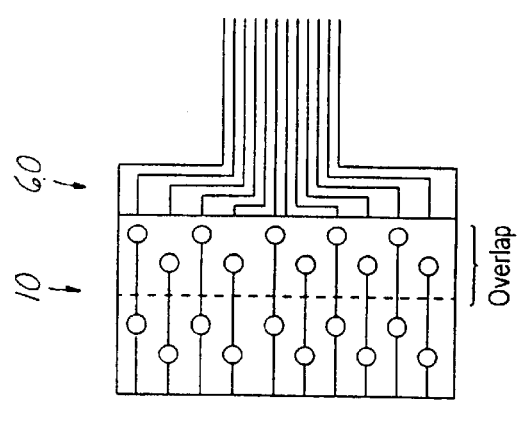
Figure 7:
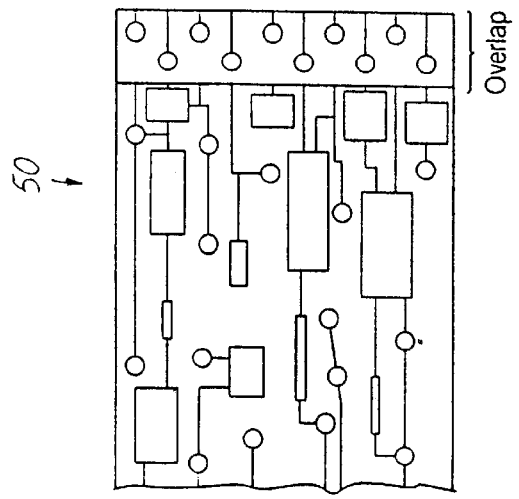
Figure 7:
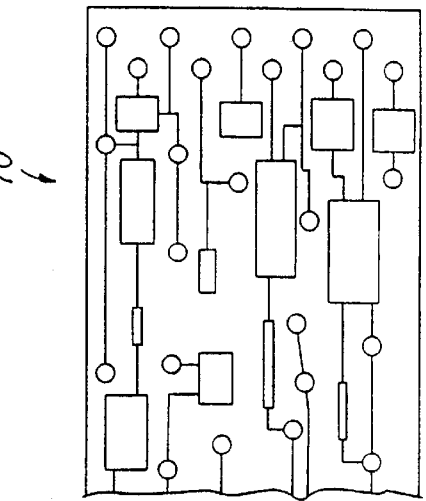

Various other modifications to the present invention may occur to those skilled in the art to which the present invention pertains. For example, although the foregoing examples illustrate only two circuits being connected together at any given time (e.g., 50 and 60), the present invention may in fact be used to connect together more than two circuits at a time. Also, while the most useful shape for the interconnecting article 10 may be generally rectangular with the first and second edges 14/16 being generally opposed from one another (as illustrated in FIGS. 1–4), the article 10 may assume any other desired shape, such as that shown in FIG. 5. Additionally, although FIGS. 3–4 illustrate the removal of only the first circuit 50, it should be apparent that the article 10 could alternatively have been cut along the cutting line 32 at the other end thereof, thus severing the second circuit 60 instead. Moreover, in some applications it may be desirable to limit the number of sets of third connection features to only one; although this might at first seem to limit the overall circuit to only one repair, it should be apparent that once the article 10 is cut along its cutting line 30/32 and one of the circuits 50/60 is severed away, a second article 10' having only one set of third connection features may be attached between the first article 10 and the replacement circuit 70, as illustrated in FIGS. 6–7. In this way, each time a circuit replacement is made, a new interconnecting article 10' (having only one set of third connection features 24) may be used Additionally, although the connection features 20/22/24 are illustrated in the drawings as being generally larger than their respective circuit traces, it is also possible that the features 20/22/24 may be generally the same size as or even smaller than the traces, especially when the circuit traces are very wide (e.g., for carrying power). Also, it may be desirable to provide some kind of insulative covering over the third connection features 24 until they are needed (e.g., a removable tape or a flap of polymer flex substrate material.) Finally, it should be noted that while the interconnecting article 10 of the present invention is best constructed using conventional flex circuit structure (i.e., wherein the substrate 12 is made of polyester, polyimide, polyetherimide, or the like, and the circuit traces 18 are made of copper, aluminum, solder, carbon, conductive ink, or the like), it is not required that the circuits 50/60/70 which are connected together by the article 10 be made of flex. In fact, the present invention is equally applicable to circuits/circuit boards 50/60/70 made of rigid FR-4 epoxy/glass, ceramic (e.g., alumina), etched tri-layer-metal construction, and so on, including combinations of different types of circuits/circuit boards. Other modifications not explicitly mentioned herein are also possible and within the scope of the present invention. It is the following claims, including all equivalents, which define the scope of the present invention.

What is claimed is:

1. A method for the repair of electrical circuits, comprising the steps of:
   (a) providing an electrical assembly which includes:
      (i) first and second electrical circuits having respective first and second edges thereof, wherein each electrical circuit has a plurality of circuit traces thereon or therewithin terminating proximate the respective first or second edge;
      (ii) an interconnecting member comprising a flexible dielectric substrate having third and fourth edges and a plurality of circuit traces arranged on or within the substrate, wherein each trace extends from proximate the third edge to proximate the fourth edge, wherein each circuit trace includes first and second connection features thereof disposed proximate the third and fourth edges, respectively, and at least one third connection features thereof disposed between the third and fourth edges, wherein each of the connection features is a plated through hole, a plated blind via, or a mounting pad;
      (iii) wherein the first and second electrical circuits are arranged with the first and second edges thereof overlapping the third and fourth edges of the interconnecting member, respectively, with the circuit traces of the first and second electrical circuits being mechanically and electrically connected to corresponding circuit traces of the interconnecting member at the first and second connection features, respectively;
   (b) cutting the interconnecting member thereacross between the first connection features and the third connection features, thereby severing the first electrical circuit from the interconnecting member and thereby presenting a fifth edge of the interconnecting member proximate the third connection features;
   (c) providing a third electrical circuit similar to the first electrical circuit and a second interconnecting member comprising a flexible dielectric substrate having seventh and eighth edges and a plurality of circuit traces arranged on or within the substrate, wherein each trace extends from proximate the seventh edge to proximate the eighth edge, wherein each circuit trace includes fourth and fifth connection features thereof disposed proximate the seventh and eighth edges, respectively, and at least one sixth connection features thereof disposed between the seventh and eighth edges, wherein each of the connection features is a plated through hole, a plated blind via, or a mounting pad;
   (d) arranging the second interconnecting member and the third electrical circuit such that a sixth edge of the third electrical circuit contactedly overlaps the seventh edge of the second interconnecting member and the eighth edge contactedly overlaps the fifth edge of the interconnecting member; and
   (e) mechanically and electrically connecting circuit traces of the third electrical circuit with corresponding circuit traces on the second interconnecting member at the fourth connection features, and the circuit traces of the second interconnecting member with corresponding circuit traces on the interconnecting member at the third and fifth connection features.

2. A method according to claim 1 wherein said first, second and third connection features of the interconnecting member and said fourth, fifth, and sixth connection features of the second interconnection member are generally evenly distributed along the circuit traces of the interconnecting member and the second connecting member.

3. A method according to claim 1, wherein each of the first, second, third, fourth, fifth and sixth connection features is aligned, with respect to all corresponding other of the first, second, third, fourth, fifth and sixth connection features, along a generally straight line running transverse to the length of the circuit traces.

4. A method according to claim 1, wherein each of the first, second, third, fourth, fifth and sixth connection features is aligned, with respect to all corresponding other of the first, second, third, fourth, fifth and sixth connection features, along a generally zigzagged line running transverse to the length of the circuit traces.

5. A method according to claim 1, wherein the substrate of the interconnecting member and the second interconnecting member is made of polyester, polyimide, or polyetherimide, and the circuit traces of the interconnecting member and the second interconnecting member are made of copper, carbon, aluminum, solder, or conductive ink.

6. A method according to claim 1, further comprising the steps
   (f) cutting the second interconnecting member thereacross between the fifth connection features and the sixth connection features, thereby severing the second electrical circuit from the second interconnecting member and thereby presenting a ninth edge of the second interconnecting member proximate the third connection features;
   (g) providing a fourth electrical circuit similar to the second electrical circuit and a third interconnecting member comprising a flexible dielectric substrate having eleventh and twelfth edges and a plurality of circuit traces arranged on or within the substrate, wherein each trace extends from proximate the eleventh edge to proximate the twelfth edge, wherein each circuit trace includes seventh and eighth connection features thereof disposed proximate the eleventh and twelfth edges, respectively, and at least one ninth connection features thereof disposed between the eleventh and twelfth edges, wherein each of the connection features is a plated through hole, a plated blind via, or a mounting pad;
   (h) arranging the third interconnecting member and the fourth electrical circuit such that a tenth edge of the fourth electrical circuit contactedly overlaps the twelfth edge of the third interconnecting member and the eleventh edge contactedly overlaps the ninth edge of the second interconnecting member; and
   (i) mechanically and electrically connecting circuit traces of the fourth electrical circuit with corresponding circuit traces on the third interconnecting member at the eighth connection features, and the circuit traces of the third interconnecting member with corresponding circuit traces on the second interconnecting member at the sixth and seventh connection features.

7. A method according to claim 1, wherein each of the third connection features are exposed on at least one surface of the interconnecting member, and wherein a piece of flexible tape is positioned over the third connection features, further comprising the step of:

removing the flexible tape prior to the step of arranging the second interconnecting member and the third electrical circuit.

8. A method for the repair of electrical circuits, comprising the steps of:

(a) providing an electrical assembly which includes:
        (i) first and second electrical circuits having respective first and second edges thereof, wherein each electrical circuit has a plurality of circuit traces thereon or therewithin terminating proximate the respective first or second edge;
        (ii) an interconnecting member comprising a flexible dielectric substrate having third and fourth edges and a plurality of circuit traces arranged on or within the substrate, wherein each trace extends from proximate the third edge to proximate the fourth edge, wherein each circuit trace includes first and second connection features thereof disposed proximate the third and fourth edges, respectively, and third and fourth connection features thereof disposed between the third and fourth edges, wherein each of the connection features is a plated through hole, a plated blind via, or a mounting pad;
        (iii) wherein the first and second electrical circuits are arranged with the first and second edges thereof overlapping the third and fourth edges of the interconnecting member, respectively, with the circuit traces of the first and second electrical circuits being mechanically and electrically connected to corresponding circuit traces of the interconnecting member at the first and second connection features, respectively;
    (b) cutting the interconnecting member there across between the first connection features and the third connection features, thereby severing the first electrical circuit from the interconnecting member and thereby presenting a fifth edge of the interconnecting member proximate the third connection features;
    (c) arranging a third electrical circuit similar to the first electrical circuit such that a sixth edge contactedly overlaps the fifth edge of the interconnecting member;
    (d) mechanically and electrically connecting circuit traces of the third electrical circuit with corresponding circuit traces on the interconnecting member at the third connection features;
    (e) cutting the interconnecting member thereacross between the second connection features and the fourth connection features, thereby severing the second electrical circuit from the interconnecting member and thereby presenting a seventh edge of the interconnecting member proximate the fourth connection features;
    (f) arranging a fourth electrical circuit similar to the second electrical circuit such that an eighth edge thereof contactedly overlaps the seventh edge of the interconnecting member; and
    (g) mechanically and electrically connecting circuit traces of the fourth electrical circuit with corresponding circuit traces on the interconnecting member at the fourth connection features.

9. A method according to claim 8, wherein each of the third and fourth connection features are exposed on at least one surface of the interconnecting member, and wherein a first piece of flexible tape is positioned over the third connection features and a second piece of flexible tape is positioned over the fourth connection features, further comprising the step of:

removing the first piece of flexible tape prior to the step of arranging the third electrical circuit; and removing the second piece of flexible tape prior to the step of arranging the fourth electrical circuit.

\* \* \* \* \*